United States Patent
Chen et al.

(10) Patent No.: US 11,289,547 B2
(45) Date of Patent: Mar. 29, 2022

(54) DISPLAY PANEL ENHANCING UNIFORMITY OF DISPLAY BY ARRANGING LIGHT PROCESSING LAYERS

(71) Applicant: CHENGDU VISTAR OPTOELECTRONICS CO., LTD., Sichuan (CN)

(72) Inventors: Huashan Chen, Kunshan Suzhou (CN); Xiaolong Yang, Kunshan Suzhou (CN); Rubo Xing, Kunshan Suzhou (CN); Dong Wei, Kunshan Suzhou (CN); Jiantai Wang, Kunshan Suzhou (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 129 days.

(21) Appl. No.: 16/775,398

(22) Filed: Jan. 29, 2020

(65) Prior Publication Data

US 2020/0168669 A1 May 28, 2020

Related U.S. Application Data

(63) Continuation of application No. PCT/CN2019/084868, filed on Apr. 28, 2019.

(30) Foreign Application Priority Data

Aug. 31, 2018 (CN) .......................... 201811014914.8

(51) Int. Cl.
*H01L 27/32* (2006.01)
*H01L 51/52* (2006.01)

(52) U.S. Cl.
CPC ........ *H01L 27/322* (2013.01); *H01L 51/5268* (2013.01); *H01L 51/5284* (2013.01); *H01L 2251/5369* (2013.01)

(58) Field of Classification Search
CPC combination set(s) only.
See application file for complete search history.

(56) References Cited

U.S. PATENT DOCUMENTS

| | | | |
|---|---|---|---|
| 2009/0207111 A1* | 8/2009 | Wang | G09F 9/33 345/83 |
| 2010/0219429 A1* | 9/2010 | Cok | H01L 51/5268 257/89 |

(Continued)

FOREIGN PATENT DOCUMENTS

| | | | |
|---|---|---|---|
| CN | 103633109 A | 3/2014 | |
| CN | 103839962 A | 6/2014 | |

(Continued)

OTHER PUBLICATIONS

International Search Report for Application No. PCT/CN2019/084868 dated Jul. 25, 2019. (9 pages).

(Continued)

*Primary Examiner* — Nduka E Ojeh
(74) *Attorney, Agent, or Firm* — Maier & Maier, PLLC

(57) ABSTRACT

The present application discloses a display panel. The display panel comprises a substrate and a plurality of pixel units disposed on the substrate, each of the plurality of pixel units comprises a plurality of sub-pixel units, each of the plurality of sub-pixel units comprises a light emitting layer, the plurality of sub-pixel units comprise at least one first type of sub-pixel unit, and the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located.

19 Claims, 3 Drawing Sheets

(56) References Cited

U.S. PATENT DOCUMENTS

| | | | | |
|---|---|---|---|---|
| 2014/0192294 A1* | 7/2014 | Chen | ............... | G02F 1/133514 |
| | | | | 349/69 |
| 2020/0051959 A1* | 2/2020 | Pschenitzka | .......... | H01L 33/505 |
| 2020/0168663 A1* | 5/2020 | Choi | ................... | H01L 33/0093 |
| 2020/0395423 A1* | 12/2020 | Ahmed | ................... | H01L 33/44 |
| 2021/0151422 A1* | 5/2021 | Iguchi | .................... | H01L 33/60 |

FOREIGN PATENT DOCUMENTS

| | | |
|---|---|---|
| CN | 104538427 A | 4/2015 |
| CN | 106876433 A | 6/2017 |
| CN | 104538430 B | 10/2017 |
| CN | 107209419 A | 6/2018 |
| CN | 108110120 A | 6/2018 |
| CN | 106910760 B | 8/2019 |
| JP | 2004152572 A | 5/2004 |

OTHER PUBLICATIONS

Chinese First office action in corresponding Chinese Application No. 201811014914.8, dated Sep. 29, 2021.

* cited by examiner

DISPLAY PANEL ENHANCING UNIFORMITY OF DISPLAY BY ARRANGING LIGHT PROCESSING LAYERS

CROSS-REFERENCE TO RELATED APPLICATIONS

The present application: is a continuation-application of International (PCT) Patent Application No. PCT/CN2019/084868 filed on Apr. 28, 2019 which claims foreign priority of Chinese Patent Application No. 201811014914.8, filed on Aug. 31, 2018 in the China National intellectual Property Administration, the entire contents of which are hereby incorporated by reference.

TECHNICAL FIELD

The present application relates to the field of display technology, and in particular, to a display panel.

BACKGROUND

With the development of science and technology, display panels have increasingly become a necessity of people's life, and are a competing focus of research and development of major manufacturers.

Current display panels usually have a problem of uneven light emission. How to make a display panel emit light more uniformly and thereby achieve better display effect is a focus problem concerned by major panel manufacturers.

SUMMARY

A technical problem mainly solved by the present application is to provide a display panel, which can improve uniformity of light conversion of pixel units.

In order to solve the above technical problem, a technical solution adopted by one embodiment of the present application is to provide a display panel, wherein, the display panel comprises a substrate and a plurality of pixel units disposed on the substrate, each of the plurality of pixel units comprises a plurality of sub-pixel units, each of the plurality of sub-pixel units comprises a light emitting layer, the plurality of sub-pixel units comprise at least one first type of sub-pixel unit, and the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located.

In order to solve the above technical problem, a technical solution adopted by one embodiment of the present application is to provide a display panel, comprising: a substrate; and a plurality of pixel units disposed on the substrate; wherein, each of the plurality of pixel units comprises a plurality of sub-pixel units, each of the plurality of sub-pixel units comprises a light emitting layer; the plurality of sub-pixel units comprise at least one first type of sub-pixel unit and at least one second type of sub-pixel unit, the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located; the at least one second type of sub-pixel unit comprises only the light emitting layer, while does not comprise any light processing layer.

In order to solve the above technical problem, a technical solution adopted by one embodiment of the present application is to provide a display panel, comprising: a substrate; a plurality of pixel units disposed on the substrate, wherein, each of the plurality of pixel units comprises a plurality of sub-pixel units, each of the plurality of sub-pixel unit comprises a light emitting layer; the plurality of sub-pixel units comprise at least one first type of sub-pixel unit, the first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located; and a black matrix, wherein the black matrix is disposed between the first light processing layers of adjacent ones of the plurality of sub-pixel units, while is not disposed between adjacent light emitting layers.

In the embodiments of the present application, the display panel is configured to comprise, a substrate and a plurality of pixel units disposed on the substrate, each of the plurality of pixel units comprises a plurality of sub-pixel units, each of the plurality of sub-pixel units comprises a light emitting layer, the plurality of sub-pixel units comprise at least one first type of sub-pixel unit, and the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located. By the above manner, uniformity of light conversion of the light emitting layer can be improved, so that display effect of the display panel is improved.

DETAILED DESCRIPTION

Technical solutions in embodiments of the present application will be described clearly and completely below in accompany with drawings of the embodiments of the present application. It should be understood that the specific embodiments described here are only intended to illustrate the present application, but not to limit the present application. Additionally, it should also be noted that the drawings only show a part rather than total structure relating to the present application. Based on the embodiments of the present application, any other embodiment obtained by one of ordinary skill in the art on the premise of no creative labor belongs to the protection scope of the present application.

Figure 1:
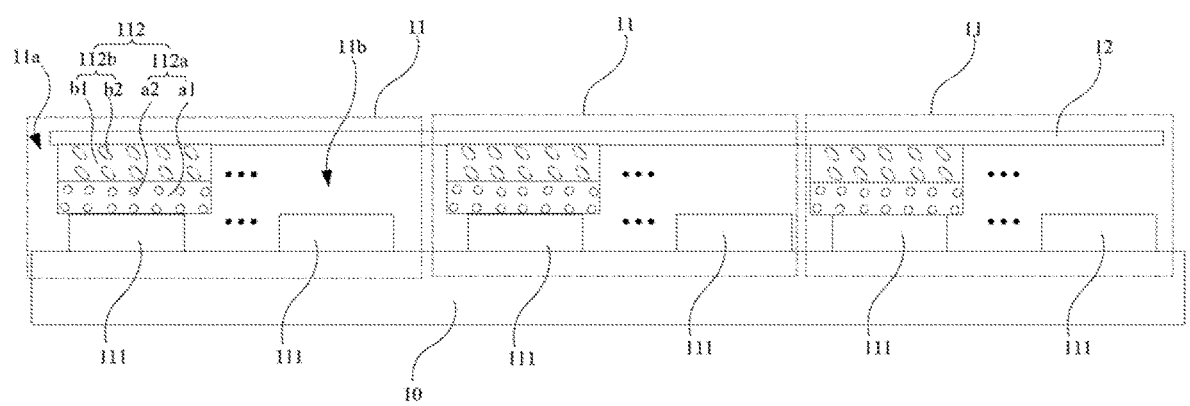
FIG. 1 is a structural schematic view of a first embodiment of a display panel of the present application.

Referring to FIG. 1, FIG. 1 is a structural schematic view of an embodiment of a display panel of the present application. In this embodiment, the display panel comprises a substrate 10 and a plurality of pixel units 11.

The substrate 10 can be a substrate of hard materials, such as a glass substrate, a plastic substrate, etc. The substrate 10 can also be a substrate of soft material, embodiments of the present application have no restriction on this.

The plurality of pixel units 11 are disposed on the substrate 10 in an array.

Each of the plurality of pixel units 11 comprises a plurality of sub-pixel units 11a, 11b, FIG. 1 only shows two sub-pixel units 11a, 11b, which are only schematic; in fact, more sub-pixel units can be comprised. For example, the plurality of sub-pixel units can comprise red, green, and blue sub-pixel units, the plurality of sub-pixel units can also comprise red, green, blue, and white sub-pixel units. Embodiments of the present application have no restriction on this. The plurality of sub-pixel units 11a, 11b can be set side-by side, and implement display of various colors by light mixing.

Each of the sub-pixel units 11a, 11b comprises a light emitting layer 111. The light emitting layers 111 of all of the sub-pixel units 11a, 11b are disposed on the substrate 10 in an array to form a light emitting layer array.

At least one sub-pixel unit 11a (a first type of sub-pixel unit 11a) further comprises a first light processing layer 112 besides comprising the light emitting layer 111.

The first light processing layer 112 is positioned at a side where a light emitting surface of the light emitting, layer 111 of the at least one sub-pixel unit 11a is located. In other words, the at least one sub-pixel 11a comprises the light emitting layer 111 and the first light processing layer 112 sequentially disposed on the substrate 10 as a laminated structure along a light emitting direction of the display panel.

The first light processing layer 112 comprises a light conversion layer 112a and a light diffusion layer 112b arranged as a laminated structure. By disposing the light conversion layer 112a, light conversion for the light emitting layer 111 is implemented. By disposing the light diffusion layer 112b, uniformity of light conversion can be improved.

The light conversion layer 112a can comprise a transparent matrix a1 and a light conversion material a2 doped in the transparent matrix a1. The light conversion material a2 can be distributed in the transparent matrix a1 uniformly.

Optionally, the transparent matrix a1 can be transparent resin, such as PMMA (polymethyl methacrylate). It should be understood that the transparent matrix a1 can be other materials, and embodiments of the present application have no restriction on this, Optionally, the light conversion material a2 can, be a quantum dot material, stimulation light emitted by the light emitting layer 111 stimulates the quantum dot material to emit light with a corresponding color. The light conversion material a2 can also be other materials having a function of performing color conversion for stimulation light. Embodiments of the present application have no restriction on this.

The light diffusion layer 112b can comprise a transparent matrix, b1 and a light diffusion material b2 doped in the transparent matrix W. The light diffusion layer b2 can be distributed in the transparent matrix b1 uniformly.

Optionally, the light diffusion material b2 can be nano barium sulfate, calcium carbonate, silicon dioxide, and so on. The light diffusion material b2 can be distributed in the transparent, matrix b1 in the form of particles, for example, the light diffusion material b2 can be light diffusion particles. The light diffusion material b2 is not limited to the above materials, and can also be other materials having a light diffusion function or a light homogenizing function.

In the drawings, the light diffusion material b2 is denoted by ellipses, and the light conversion material a2 is denoted by circles, but these are not real shapes of the two kinds of materials. The drawings are only intended to illustrate and facilitate distinguishing the two kinds of materials.

Optionally, the light conversion layer 112a and the light diffusion layer 112b are sequentially disposed alone a light emitting direction of the light emitting layer 111. That is, the light emitting layer 111, the light conversion layer 112a, and the light diffusion layer 112b are sequentially disposed as a laminated structure along a light emitting direction of the light emitting layer 111. The light emitting direction can be a vertical and upward direction in the drawings.

Optionally, the display panel can further comprises an encapsulation layer 12, the encapsulation layer 12 is disposed at sides of the plurality of pixel units 11 away from the substrate 10, and the light diffusion layer 112b is disposed on a surface of the encapsulation layer 12 adjacent to the substrate 10.

That is, the light diffusion layer 112b can be fixedly combined with a lower surface of the encapsulation layer 12, so that manufacturing of the light diffusion layer 112b can be facilitated, and product manufacturing yield can be improved.

In other embodiments, it is possible to implement the function of the light diffusion layer 112b by mixing diffusion particles in the encapsulation layer 12, and it is not necessary to add another transparent matrix layer to mix diffusion particles. In one aspect, materials can be saved, and in another, aspect, a whole thickness of the display panel can be reduced, and effect of improving uniformity of light conversion can also be implemented.

In other embodiments, positions of the light diffusion layer 112b and the light conversion layer 112a can be exchanged, for example, the light diffusion layer 1121 and the light conversion layer 112a are sequentially disposed along a light emitting direction of the light emitting layer 111. That is, the light emitting layer 111, the light diffusion layer 112b, and the light conversion layer 112a are sequentially disposed as a laminated structure along a light emitting direction of the light emitting layer 111.

In this embodiment, at least another sub-pixel unit 11b (a second type of sub-pixel unit 11b) can comprise only the light emitting layer 111, while does not comprise any light processing layer.

Figure 2:
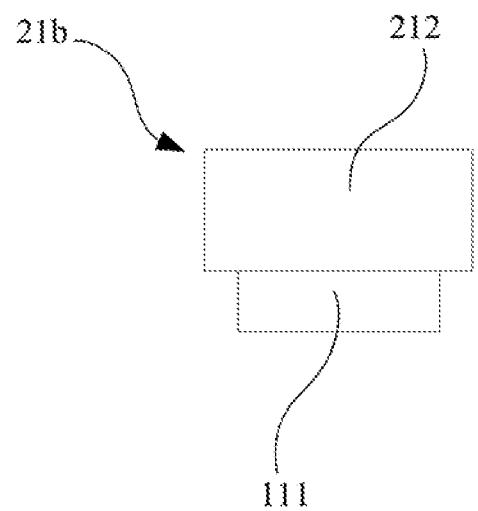
FIG. 2 is a structural schematic view of another embodiment of a second type of sub-pixel unit of an embodiment of the present application.

Referring to FIG. 2, FIG. 2 is a structural schematic view of another embodiment of a second type of sub-pixel unit of an embodiment of the present application. In this embodiment, at least another sub-pixel unit 21b (the second type of sub-pixel unit 21b) further comprises a second light processing layer 212 besides comprising the light emitting layer 111, the second light processing layer 212 is disposed at a side where a light emitting surface of the light emitting layer 111 of the at least another sub-pixel unit 21b is located.

A color of light emitted by the at least another sub-pixel unit 21b is a color of light emitted by the light emitting layer 111. For example, a color of light emitted by the at least another sub-pixel unit 21b is blue, and stimulation light emitted by the light emitting layer 111 is also blue; therefore, it is not necessary to dispose a light conversion layer to convert the color of the stimulation light of the light emitting layer 111. The second light processing layer 212 does not have any light conversion function. In particular, the second light processing layer 212 can have the following situations.

As shown in FIG. 2, in a first situation, the second light processing layer 212 comprises the transparent matrix, while does not comprise the light conversion layer and the light diffusion layer.

Optionally, a surface of the first light processing layer 112 away front the substrate 10 is flush with a surface of the second light processing layer 212 away from the substrate 10.

Since the first type of sub-pixel unit comprises the first light processing layer 112, and the first light processing layer 112 usually needs a transparent matrix, in order to ensure light emission homogeneity of the first type of sub-pixel unit 11a and the second type of sub-pixel unit 11b, the second light processing layer 212 comprising only a transparent matrix is disposed; in another aspect, in order to ensure planarization of a light emitting surface of a pixel unit matrix and facilitate formation of the encapsulation layer 12, the second light processing, layer 212 comprising only a transparent matrix is disposed.

Figure 3:
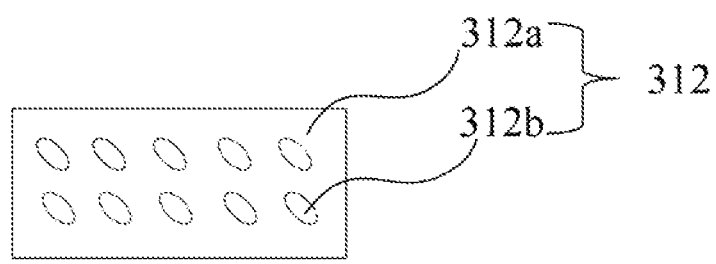
FIG. 3 is a structural schematic view of another embodiment of a second light processing layer of an embodiment of the present application.

Referring to FIG. 3, FIG. 3 is a structural schematic view of another embodiment of a second light processing layer of an embodiment of the present application. In a second situation, a second light processing layer 312 is a light diffusion layer, that is, the second light processing layer 312 comprises a transparent matrix 312a. That is, the second light processing layer 312 comprises only a light diffusion layer, while does not comprise any light conversion layer.

Since the first type of sub-pixel unit 11a comprise the light diffusion material b2, in order to ensure light emission homogeneity of the second type of sub-pixel unit 21b and the first type of sub-pixel unit 11a, and ensure light emission uniformity of the second type of sub-pixel unit 21b, the light diffusion material 312b is also disposed in the second light processing layer 312.

A width of the first light processing layer 122 is greater than a width of the light emitting layer 111 of the at least one sub-pixel unit 11a, and a width of the second light processing layer 212 or 312 is greater than a width of the light emitting layer 111 of the at least another sub-pixel unit 11b. By the above manner, the light processing layers' utilization ratios for light of the light emitting layer can be improved.

The first type of sub-pixel unit 11a comprises a first sub-pixel unit and a second sub-pixel unit. The light conversion layer of the first sub-pixel unit is a first light conversion layer, the first conversion layer comprises a first quantum dot material with a first light conversion color, the light conversion layer of the second sub-pixel unit is a second light conversion layer, the second conversion layer comprises a second quantum dot material with a second light conversion color, a color of light emitted by the light emitting layer is different from the first light conversion color and the second light conversion color. The at least one second type of sub-pixel unit comprises a third sub-pixel unit, a color of light emitted by the third sub-pixel unit is the color of light emitted by the light emitting layer. Optionally, the first light conversion color is red, the second light conversion color is green, and the color of light emitted by the light emitting layer is blue. See the following description of a second embodiment of a display panel for details.

Figure 4:
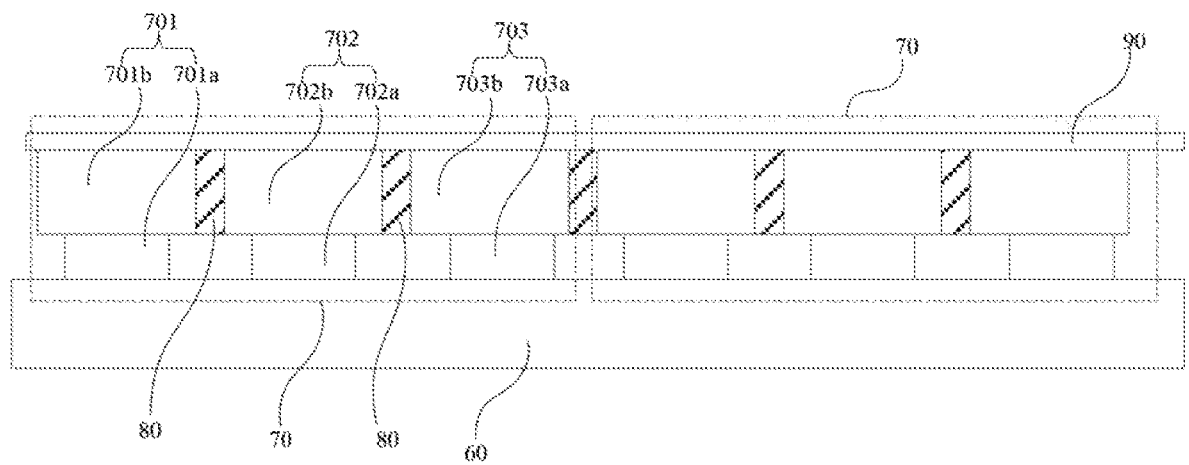
FIG. 4 is a structural schematic view of a second embodiment of a display panel of the present application.

Referring to FIG. 4, FIG. 4 is a structural schematic view of a second embodiment of a display panel of the present application. In this embodiment, the display panel comprises a substrate 60, a plurality of pixel units 70, a black matrix 80, and an encapsulation layer 90.

The substrate 60 can be a substrate of hard materials, such as a glass substrate. The substrate 60 can also be a substrate of soft materials, embodiments of the present application have no restriction on this.

The plurality of pixel units 70 are disposed on the substrate 60 in an array.

Optionally, each of the pixel units 70 comprises a plurality of sub-pixel units 701, 702, 703. In particular, the plurality of sub-pixels 701, 702, 703 can comprise a first sub-pixel unit 701, a second sub-pixel unit 702, and a third sub-pixel unit 703. In this embodiment, the first sub-pixel unit 701 is a red sub-pixel unit, the second pixel-unit 702 is a green sub-pixel unit, and the third sub-pixel 703 is a blue sub-pixel unit.

In other embodiments, the plurality of sub-pixel units can also comprise a first sub-pixel unit, a second sub-pixel unit, a third sub pixel unit, and a fourth sub-pixel unit, which can be red, green, blue, and white sub-pixel units respectively.

The red sub-pixel unit 701 comprises a light emitting layer 701a and a first light processing layer 701b disposed to be sequentially away from the substrate 60. The first light processing layer 701b is positioned at a side of a light emitting surface of the light emitting layer 701a.

The green sub-pixel unit 702 comprises a light emitting layer 702a and a first light processing layer 702b disposed to be sequentially away from the substrate 60. The first light processing layer 702b is positioned at a side of a light emitting surface of the light emitting layer 702a.

The blue sub-pixel unit 703 comprises a light emitting layer 703a and a second light processing layer 703b disposed to be sequentially away from the substrate 60. The second light processing layer 703b is positioned at a side of a light emitting surface of the light emitting layer 703a.

Colors of light emitted by the light emitting layers 710a, 702a, 703a are blue, in other embodiments, the blue sub-pixel unit 703 can comprise no second light processing layer 703b, and it is possible to dispose only the light emitting layer 703a.

The first light processing layer 701b and first light processing layer 702b are similar in structure, each of them comprises a light diffusion layer and a light conversion, layer disposed, in a laminated structure. Specific structures of the light diffusion layer and the light conversion layer refer to the description of the above embodiments, and are not repeated here.

A light conversion material in the first light processing layer 701b is a first quantum dot material, such as a red quantum dot material. A light conversion material in the first light processing layer 702b is a second quantum dot material, such as a green quantum dot material.

Optionally, the second light processing layer 703b comprises a transparent matrix and a light diffusion material doped in the transparent matrix.

Optionally, the first quantum dot material in the red sub-pixel unit 701 is less than the second quantum dot material in the green sub-pixel unit 702.

Since blue light may be absorbed by green light and red light, and green light may be absorbed by red light, setting the quantity of the green quantum dot material in the green sub-pixel unit 702 to be more and setting the quantity of the red quantum dot material in the red sub-pixel unit 701 to be less can offset the loss of green light, improve a white light index of the display panel when displaying white light, and increase a service life of the green sub-pixel unit 702.

Optionally, the light diffusion material in the red sub-pixel unit 701 is more than the light diffusion material in the green sub-pixel unit 702, the light diffusion material in the green sub-pixel unit 702 is more than the light diffusion material in the blue sub-pixel unit 703. In a preferred embodiment, the light diffusion material in the red sub-pixel unit 701 can be a first light diffusion material, the light diffusion material in the green sub-pixel unit 702 can be a second light diffusion material, and the light diffusion material in the blue sub-pixel unit 703 can be a third light diffusion material; the first, second, and third light diffusion materials can be the same kind of material.

Since the more light diffusion material, the stronger the light diffusivity of a sub-pixel unit, and the easier light endued by the sub-pixel unit to be absorbed by ambient other sub-pixel units, in order to reduce absorption for blue light by green light and red light and absorption for green light by red light, a light diffusivity of the blue sub-pixel unit 703 is set to be the smallest, that of the green sub-pixel unit 702 is medium, and alight diffusivity of the red sub-pixel unit 710 is set to be the strongest. This can reduce the loss of blue light and green light, improve a white light index of the display panel when displaying white light, and increase service lives of the green sub-pixel unit 702 and the blue sub-pixel unit 703.

Optionally, a surface of the first light processing layer 701b away from the substrate 60, a surface of the first light processing layer 702b away from the substrate 60, and a surface of the second light processing layer 703b away from the substrate 60 are flush, such that the surfaces of the sub-pixel units away from the substrate 60 are planarized, and it is conducive to form the encapsulation layer 90 subsequently.

Optionally, a width of the first light processing layer 701b is greater than a width of the light emitting layer 701a, a width of the first light processing layer 702b is greater than a width of the light emitting layer 702a, a width of the second light processing layer 703b is greater than a width of the light emitting layer 703a, such that the light processing layers' utilization ratios for light emitted by the light emitting layers can be improved. In other embodiments, a light processing layer can also have the same width as its corresponding light emitting layer, embodiments of the present application have no restriction on this.

Specific structures of the first light processing layers 701b, 702b and the second light processing layer 703b in this embodiment can be understood in combination with the description in the first embodiment, and are not repeated here.

The black matrix 80 is disposed between adjacent sub-pixel units. Optionally, the black matrix 80 is disposed between adjacent light processing layers, and the black matrix 80 can be not disposed between adjacent light emitting layers. For example, the black matrix 80 is disposed between the first light processing layer 701b and the first processing layer 702b, and the black matrix 80 is also disposed between the first light processing layer 702b and the second processing layer 703b The black matrix 80 is further disposed between two adjacent pixel units 70.

A main function of the black matrix 80 disposed between adjacent light processing layers is to prevent crosstalk among light with different colors (red, green, blue) due to different conversion colors between adjacent sub pixel units (light conversion materials), and also has functions of shielding light and preventing crosstalk between two adjacent light, emitting layers. It is not necessary to dispose the black matrix between adjacent light emitting layers, and thus materials can be saved, In order to improve the capability of preventing crosstalk between two adjacent light emitting layers, and in order to avoid that the black matrix 80 only disposed between the light processing layers cannot shield crosstalk between adjacent light emitting layers, it is possible to also dispose the black matrix between adjacent light emitting layers according to requirements, so as to avoid optical crosstalk between two adjacent light emitting layers, further avoid, inference of light emitting layers of adjacent sub-pixel units when controlling a light emitting layer corresponding to a sub-pixel unit to light emit, improve a display control accuracy, so that display quality can be improved.

The encapsulation layer 90 is disposed at a side where light emitting surfaces of the pixel units 70 are located, and in particular, disposed, on a pixel unit array formed by a plurality of pixel units 70.

In any embodiment of the present application, a light emitting layer array comprising all of the light emitting layers is first formed on a substrate, and then light processing layers (first light processing layers or second light processing layers) are formed on corresponding light emitting layers, in one aspect, for simplification of manufacturing processes, and in another aspect, for improving density of pixels and improving precision degree of display. A process for forming the light emitting layers on the substrate is not limited to a mask manufacturing process, and a process for forming the light processing layers on the light emitting layers is not limited to a mask manufacturing process or a spray printing process.

In the embodiments of the present application, the display panel is configured to comprise a substrate and a plurality of pixel units disposed on the substrate, each of the plurality of pixel units comprises a plurality of sub-pixel units, each of the plurality of sub-pixel units comprises a light emitting layer, the plurality of sub-pixel units comprise at least one first type of sub-pixel unit, and the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located. By the above manner, uniformity of light conversion of the light emitting layer can be improved, so that display effect of the display panel is improved.

Above are only embodiments of the present applications and are not intended to limit the patent scope of the present application. For the same reason, any equivalent structural change or equivalent process change made according to the content of the specification and the drawings of the present application, or any direct or indirect application in other relating technical fields, are all comprised in the patent protection scope of the present application.

What is claimed is:

1. A display panel, comprising:
a substrate;
a plurality of pixel units disposed on the substrate;
wherein, each of the plurality of pixel units comprises a plurality of sub-pixel units, each of the plurality of sub-pixel units comprises a light emitting layer, the plurality of sub-pixel units comprise at least one of first type of sub-pixel unit, and the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located; and an encapsulation layer, the encapsulation layer is disposed at sides of the plurality of pixel units away from the substrate, and the light diffusion layer is disposed on a surface of the encapsulation layer adjacent to the substrate, wherein the light diffusion layer is in direct contact with a lower surface of the encapsulation layer, and both of the lower surface and an upper surface of the encapsulation layer are planar.

2. The display panel according to claim 1, wherein, the light conversion layer and the light diffusion layer are sequentially disposed along a light emitting direction of the light emitting layer, the light conversion layer is disposed on the light emitting layer for an implementation of a light conversion for the light emitting layer, the light diffusion layer is disposed on the light conversion layer for an uniformity of a light conversion, and the encapsulation layer is disposed on the light diffusion layer.

3. The display panel according to claim 1, wherein, the plurality of sub-pixel units further comprise at least one second type of sub-pixel unit, the at least one second type of sub-pixel unit comprises a second light processing layer, the second light processing layer is disposed on a side where a light emitting surface of the light emitting layer of the at least one second type of sub-pixel unit is located, and the second light processing layer has no light conversion function.

4. The display panel according to claim 3, wherein, the at: least one first type of sub-pixel unit comprises a first sub-pixel unit and a second sub-pixel unit, the light conversion layer of the first sub-pixel unit is a first light conversion layer, the first conversion layer comprises a first quantum dot material with a first light conversion color, the light conversion layer of the second sub-pixel unit is a second light conversion layer, the second conversion layer comprises a second quantum dot material with a second light conversion color; a color of light emitted by the light emitting layer is different from the first light conversion color and the second light conversion color; the at least one second type of sub-pixel unit comprises a third sub-pixel unit, a color of light emitted by the third sub-pixel unit is the color of light emitted by the light emitting layer, the light diffusion layer comprises a light diffusion material.

5. The display panel according to claim 4, wherein, the first light conversion color is red, the second light conversion color is green, the first quantum dot material in the first sub-pixel unit is less than the second quantum dot material in the second sub-pixel unit.

6. The display panel according to claim 4, wherein, the first light conversion color is red, the second light conversion color is green, the light diffusion material in the first sub-pixel unit is a first light diffusion material, the light diffusion material in the second sub-pixel unit is a second light diffusion material, and the first light diffusion material is more than the second light diffusion material.

7. The display panel according to claim 6, wherein, the second light processing layer of the third sub-pixel unit comprises a transparent matrix and a third light diffusion material doped in the transparent matrix.

8. The display panel according to claim 7, wherein, the color of light emitted by the light emitting layer is blue, and the second light diffusion material is more than the third light diffusion material.

9. The display panel according to claim 3, wherein, a surface of the first light processing layer away from the substrate is flush with a surface of the second light processing layer away from the substrate.

10. The display panel according to claim 3, wherein, a width of the first light processing layer is greater than a width of the light emitting layer of the at least one first type of sub-pixel unit, and a width of the second light processing layer is greater than a width of the light emitting layer of the at least one second type of sub-pixel unit.

11. The display panel according to claim 3, wherein, the display panel further comprises a black matrix, the black matrix is disposed between the first light processing layers of adjacent sub-pixel units, or disposed between adjacent first light processing layer and second light processing layer.

12. The display panel according to claim 1, wherein, the light conversion layer comprises a transparent matrix and a light conversion material doped in the transparent matrix.

13. The display panel according to claim 1, wherein, the light diffusion layer comprises a transparent matrix and a light diffusion material doped in the transparent matrix.

14. The display panel according to claim 1, wherein, the display panel further comprises a black matrix, the black matrix is disposed between adjacent sub-pixel units.

15. The display panel according to claim 14, wherein, the black matrix is disposed between the light emitting layers of adjacent sub-pixel units.

16. A display panel, comprising:
a substrate;
a plurality of pixel units disposed on the substrate;
wherein, each of the plurality of pixel units comprises a plurality of sub-pixel units, each of the plurality of sub-pixel units comprises a light emitting layer; the plurality of sub-pixel units comprise at least one first type of sub-pixel unit and at least one second type of sub-pixel unit, the at least one first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located; the at least one second type of sub-pixel unit comprises only the light emitting layer, while does not comprise any light processing layer; and
an encapsulation layer, the encapsulation layer is disposed at sides of the plurality of pixel units away from the substrate, and the light diffusion layer is disposed on a surface of the encapsulation layer adjacent to the substrate, wherein the light diffusion layer is in direct contact with a lower surface of the encapsulation layer, wherein, the light conversion layer and the light diffusion layer are sequentially disposed along a light emitting direction of the light emitting layer, the light conversion layer is disposed on the light emitting layer for an implementation of a light conversion for the light emitting layer, the light diffusion layer is disposed on the light conversion layer for an uniformity of a light conversion, and the encapsulation layer is disposed on the light diffusion layer.

17. A display panel, comprising:
a substrate;
a plurality of pixel units disposed on the substrate, wherein, each of the plurality of pixel units comprises a plurality of sub-pixel units, each of the plurality of sub-pixel unit comprises a light emitting layer; the plurality of sub-pixel units comprise at least one first type of sub-pixel unit, the first type of sub-pixel unit further comprises a first light processing layer, the first light processing layer comprises a light conversion layer and a light diffusion layer arranged as a laminated structure, and the first light processing layer is positioned at a side where a light emitting surface of the light emitting layer of the at least one first type of sub-pixel unit is located;

a black matrix, wherein the black matrix is disposed between the first light processing layers of adjacent ones of the plurality of sub-pixel units, while is not disposed between adjacent light emitting layers; and an encapsulation layer, the encapsulation layer is disposed at sides of the plurality of pixel units away from the substrate, and the light diffusion layer is disposed on a surface of the encapsulation layer adjacent to the substrate, wherein the light diffusion layer is in direct contact with a lower surface of the encapsulation layer, and both of the lower surface and an upper surface of the encapsulation layer are planar.

18. The display panel according to claim 17, wherein, the plurality of sub-pixel units further comprise at least one second type of sub-pixel unit the at least one second type of sub-pixel unit further comprises a second light processing, layer, the second light processing layer is disposed on a side where a light emitting surface of the light emitting layer of the at least one second type of sub-pixel unit is located, and the second light processing layer has no light conversion function; the black matrix is further disposed between adjacent first light processing layer and second light processing layer.

19. The display panel according to claim 17, wherein, the light conversion layer and the light diffusion layer are sequentially disposed along a light emitting direction of the light emitting layer, the light conversion layer is disposed on the light emitting layer for an implementation of a light conversion for the light emitting layer, the light diffusion layer is disposed on the light conversion layer for an uniformity of a light conversion, and the encapsulation layer is disposed on the light diffusion layer.

* * * * *